United States Patent [19]

Abe

[11] Patent Number: 5,017,461

[45] Date of Patent: May 21, 1991

[54] FORMATION OF A NEGATIVE RESIST PATTERN UTILIZE WATER-SOLUBLE POLYMERIC MATERIAL AND PHOTOACID GENERATOR

[75] Inventor: Naomichi Abe, Tokyo, Japan

[73] Assignee: Fujitsu Limited, Kanagawa, Japan

[21] Appl. No.: 322,037

[22] Filed: Mar. 13, 1989

[30] Foreign Application Priority Data

Mar. 15, 1988 [JP] Japan ................................ 63-59328

[51] Int. Cl.⁵ ............................ G03F 7/30; G03F 7/40
[52] U.S. Cl. .................................... 430/325; 430/176; 430/330
[58] Field of Search ........................ 430/330, 331, 325

[56] References Cited

U.S. PATENT DOCUMENTS

| | | | |
|---|---|---|---|
| 4,414,059 | 11/1983 | Blum et al. ........................... | 430/325 |
| 4,537,854 | 8/1985 | Crivello ............................... | 430/283 |
| 4,610,952 | 9/1986 | Crivello ............................... | 430/325 |
| 4,657,844 | 4/1987 | Shu et al. ............................. | 430/325 |
| 4,659,650 | 4/1987 | Moritz et al. ........................ | 430/330 |
| 4,883,740 | 11/1989 | Schwalm et al. ................... | 430/330 |

*Primary Examiner*—Charles L. Bowers, Jr.
*Assistant Examiner*—John S. Y. Chu
*Attorney, Agent, or Firm*—Armstrong, Nikaido, Marmelstein, Kubovcik & Murray

[57] ABSTRACT

A process for the formation of a negative resist pattern, comprising preparing a mixture consisting of water-soluble polymeric material having at least one hydroxyl group with a photoacid generator capable of releasing an acid upon radiation exposure, coating a solution of the resist material onto a substrate to form a resist layer, exposing layer to patterned radiation, heating the exposed resist layer in the presence of an acid as a catalyst to remove water, and developing resist layer with water to remove unexposed areas to form a resist pattern on the substrate.

13 Claims, 2 Drawing Sheets

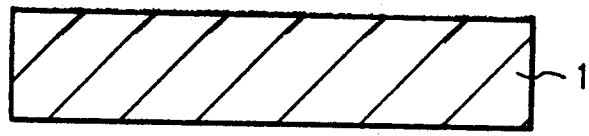
Fig. IA
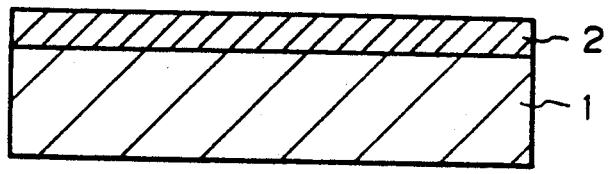
Fig. IB
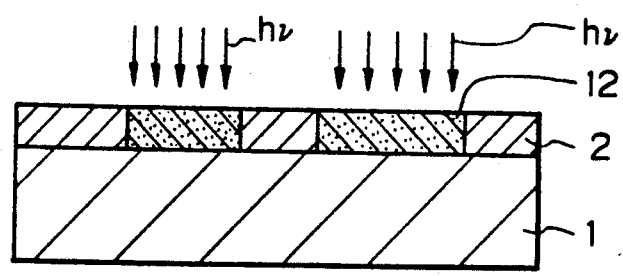
Fig. IC
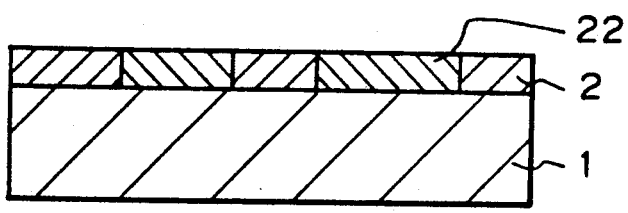
Fig. ID
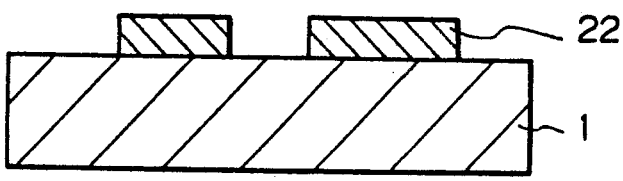
Fig. IE

INFLUENCE OF PHOTO-ACID GENERATOR ON SENSITIVITY

FORMATION OF A NEGATIVE RESIST PATTERN UTILIZE WATER-SOLUBLE POLYMERIC MATERIAL AND PHOTOACID GENERATOR

BACKGROUND OF THE INVENTION

1. Field of the Invention

The present invention relates to a resist technology, and more particularly, to a pattern-forming resist material suitable for forming negative resist patterns using deep ultraviolet (UV) radiation as an exposure radiation. The resist patterns are usually formed on a substrate or base material, i.e., a semiconductor material, during the production of semiconductor devices such as large-scale integrated (LSI) circuits, very-large-scale integrated (VLSI) circuits, and bubble memory devices. The present invention also relates to a process for the formation of resist patterns using said resist material.

2. Description of the Related Art

To attain a desired fine fabrication in the production of LSIs, VLSIs and other semiconductor devices, a plurality of pattern-forming resist materials such as rubber-like resists, photocomposable polymeric resists and novolac resin resists, as well as different exposure radiations such as ultraviolet (UV) rays, electron beams, X-rays, and ion beams, are widely used. Recently, deep UV radiation has replaced the usual UV radiation, as the deep UV radiation has a wavelength of about 200 to 300 nm, which is shorter than that of the usual UV radiation, and can satisfy the requirements for a greater a degree of fine fabrication in the resulting resist patterns. Note, it is known that various intensive research projects and development of deep UV resists have been carried out by persons skilled in the art, and in this connection, as suitable deep UV resists, it has been proposed to use photodecomposable polymeric resins, or novolac resists, which are well known as the UV resists and can be used without modification. These deep UV resists, however, have several drawbacks; the photo decomposable polymeric resins have a poor sensitivity to deep UV and a resistance to dry etching such as oxygen plasma etching, and the novolac resists show an unsatisfactory pattern resolution due to an excessively high light absorption of the benzene ring included therein.

In addition to these resists, it has been proposed to use cross-linking resists wherein a cross-linkable polymer such as polyvinyl alcohol is combined with a cross-linking agent such as diazonium salts, but these resists have an unsatisfactory pattern resolution due to swelling of the resulting resist patterns. The reason for the swelling of the resist patterns is as follows:

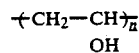
OH wherein n denotes a polymerization degree, and a diazonium salt of the formula:

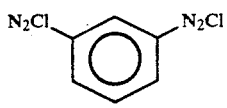

as a cross-linking agent is used as a resist material, and the resist material is selectively exposed to deep UV radiation, PVA in the exposed areas becomes insoluble in water as a result of a cross-linking reaction thereof. The water-insoluble resist pattern thus formed is represented by the following formula:

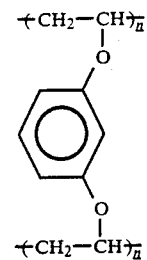

in which n is as defined above. This cross-linking reaction, however, occurs at a small portion of hydroxyl groups in PVA, because the concentration of the cross-linker is low. And thus, since the most of hydroxyl groups in PVA remains unchanged, the polymer remains hydrophilic even after the cross-linking reaction. Therefore, during development, water diffuses into the polymer and results in swelling.

SUMMARY OF THE INVENTION

An object of the present invention is to provide a novel pattern-forming resist material particularly suitable for deep UV exposure and a formation of fine negative resist patterns having a high sensitivity, a resistance to dry etching, and a good resolution.

Another object of the present invention is to provide a novel process for the formation of resist patterns, in which the problem of swelling of the patterns due to absorption of water used during development is eliminated.

These and other objects of the present invention clarified in the following detailed description, can be attained by the pattern-forming resist material and pattern formation process according to the present invention. Namely:

According to the present invention, there is provided a pattern-forming resist material comprising a water-soluble polymeric material having at least one hydroxyl group in a molecular structure thereof and a photo-acid generator which, during exposure to radiation, do not cause cross-linking of the polymeric material but can release an acid upon reaction with the polymeric material, the reaction product produced together with the acid upon reaction, when heated in the presence of the acid as a catalyst, providing a water-insoluble polymeric material, when water is removed from the reaction product, which material will provide resist patterns when developed with water.

According to the present invention, there is also provided a process for the formation of resist patterns comprising mixing a water-soluble polymeric material having at least one hydroxyl group in a molecular structure thereof with a photo-acid generator capable of releasing an acid as a result of radiation exposure for patterning to prepare a resist material, coating a solution of the resist material onto a substrate to form a resist layer, exposing the resist layer to patterned radiation to cause a reaction of the polymeric material and said photo-acid generation and a release of the acid, heating the exposed resist layer in the presence of the acid as a catalyst to remove water from the resulting reaction product in the resist layer, thereby insolubilizing the reaction product in water, and developing the resist layer with water to remove the water-soluble polymeric material in the exposed area of the layer and thus form resist patterns on the substrate.

BRIEF DESCRIPTION OF THE DRAWINGS

FIGS. 1A to 1E are cross-sectional vies showing, in sequence, the pattern formation process according to the present invention; and, FIG. 2 is a graph showing the relationship between the sensitivity of the resist material and the concentration of the photo-acid generator, 2-(N-phenylamino)phenyldiazonium sulfate, in the resist material containing PVA as the polymeric material.

DESCRIPTION OF THE PREFERRED EMBODIMENTS

Figure 2:
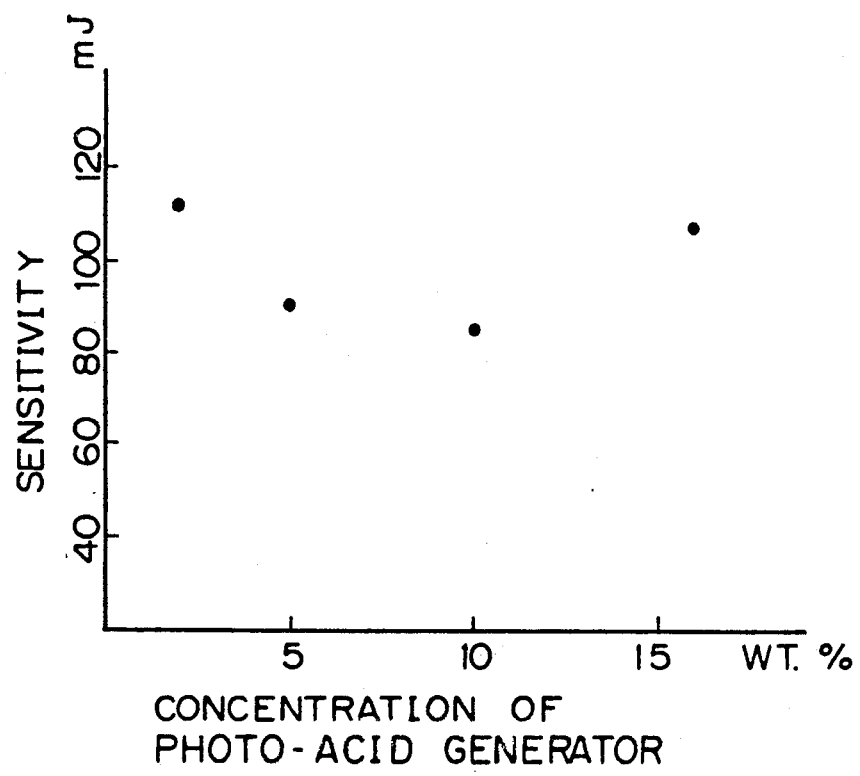

Using the resist material according to the present invention the resist patterns are formed as follows, for example:

As illustrated in FIG. 1A, a semiconductor substrate 1, for example, a silicon substrate or wafer, is prepared and washed to obtain clean surfaces. The substrate 1, although not shown, may carry any circuit parts or other elements, if desired; for example, an insulating layer such as $SiO_2$ layer, circuits such as Al circuits, and the like.

A resist material to be coated on the cleaned surface of the substrate 1 is prepared by mixing a water-soluble, hydroxyl group-containing polymeric material with a photo-acid generator, i.e., a compound capable of photographically producing and releasing an acid as a result of radiation exposure of the resist material. Here, PVA of the formula:

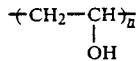

wherein n denotes a polymerization degree, is used as the polymeric material, and a diazonium salt of the formula:

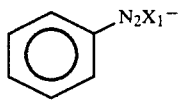

wherein $X_1$ represents a halogen atom such as Cl, is used as the photo-acid generator.

After preparation of the resist material as illustrated in FIG. 1B, the resist material is coated on the substrate 1 to form a resist layer 2. Since this polymeric material has a good solubility in water, coating is generally carried out by conventional coating methods such as spin coating using an aqueous solution of the resist material, and the coated resist material is then dried.

The resulting resist layer 2 is then selectively exposed to patterning radiation (deep UV used herein) hν through a mask (not shown), as illustrated in FIG. 1C. A wavelength of the deep UV is a commonly used one, i.e., 240 to 250 nm. During the selective exposure, the following reaction proceeds in the exposed area of the resist layer 2.

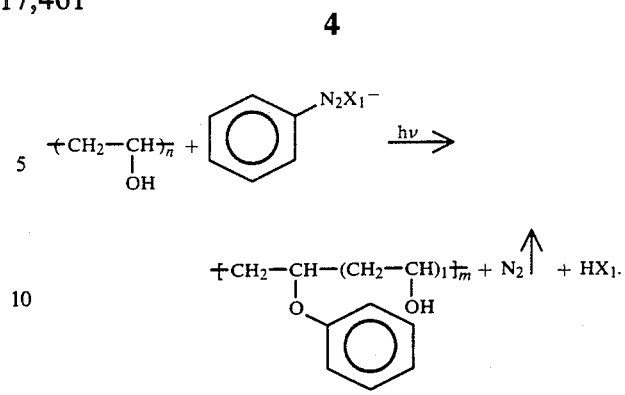

The above reaction schema shows that, during the exposure step, an acid $HX_1$ such as HCl is generated but no cross-linking reaction occurs, although such a cross-linking reaction can be found in the prior art cross-linking resists as previously described (Note: such a cross-linking reaction results in a swelling of the resist patterns). In FIG. 1C, the exposed area of the resist layer 2 contains a reaction product 12 of the PVA and diazonium salt (see, above formula), but the unexposed area thereof contains the unreacted PVA and diazonium salt.

After selective exposure, the exposed resist layer is then heated to a temperature of, for example, about 100° C., and during this heating, the following reaction proceeds in the exposed area of the resist layer 2.

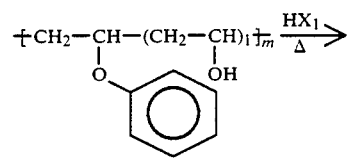

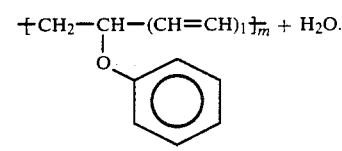

Namely, an elimination reaction of the hydroxyl group occurs in the presence of the acid $HX_1$ as a catalyst generated in the exposure step. Since water has been removed from the reaction product, the product 22 in the exposed area of the resist layer 2 now shows an insolubility in water (see, FIG. 1D). Namely, the exposed area is insolubilized in water, but the unexposed area remains water-soluble.

After the exposed area was insolubilized in water, the resist layer is developed with water to wash the unexposed area therefrom, and as shown in FIG. 1E, water-insoluble negative resist patterns 22 are thus formed on the substrate 1.

According to the present invention, since the formation of the resist patterns is carried out utilizing a variation of the polarity of the resist material used, in contrast with the prior art resist material which is cross-linked upon patterning exposure to form resist patterns, the resulting resist patterns do not suffer from swelling thereof, with the result that these resist patterns are very fine or have an increased resolution. Further, since the acid generated in the exposure step is used as a catalyst in the next reaction, the precursor thereof, i.e., the photo-acid generator, gives satisfactory effects, even if used in a small amount of 10% by weight or less. Furthermore, since the resist material having a small amount of the photo-acid generator incorporated therein has a good transparency to deep UV. The loss of resolution caused by excessively high light absorption such in the prior art novolac resists is eliminated.

The pattern-forming resist material according to the present invention comprises a water-soluble polymeric material as a basic polymer and a photo-acid generator. Preferably, the polymeric material has no aromatic ring such as benzene ring in the molecular structure thereof, as an aromatic ring-free polymeric material ensures the formation of fine resist patterns, because it does not suffer from the reduced resolution caused by specific absorption characteristics of the aromatic ring. Further, preferably the polymeric material has a structure in which a carbon atom adjacent to another carbon atom to which the hydroxyl group is bonded in the polymeric material contains at least one hydrogen atom which can be combined with the split-off hydroxyl group during the heating step to form water, which is then removed from the polymeric material.

The polymeric material used in the present invention has a wide range of molecular weights, and a suitable range of the molecular weights thereof is generally about 1,000 to 100,000, although molecular weights over or under that range also may be applied to the polymeric material, insofar as they do not have an adverse affect on the resulting resist patterns.

The hydroxyl-containing polymeric material used in the present invention may be optionally selected from a plurality of well-known hydroxyl polymers which satisfy the requirements described herein. These polymeric materials include, for example, polyvinyl alcohol (PVA) or derivatives thereof such as PVA, poly(1-methyl) vinyl alcohol and the like, and cellulose or derivatives thereof such as cellulose esters (for example, cellulose acetate and nitrocellulose), cellulose ethers (for example, methyl cellulose and ethyl cellulose) and the like. These polymeric materials may be used alone or in combinations thereof.

The photo-acid generation used together with the polymeric material, as previously described, is a compound capable of releasing an acid upon exposure to patterning radiation, but this compound does not cause a cross-linking of the polymeric material used at the same time during the exposure step. Any photo-acid generator may be used in the practice of the present invention, insofar as it satisfies the requirements described herein. These photo-acid generators include, for example, an onium salt or compound or derivatives thereof such as ammonium compounds, phosphonium compounds, oxonium compounds, sulfonium compounds and iodonium compounds (for example, p-(N-phenylamino)-phenyldiazonium sulfate, 2-(N-phenylamino)phenyldiazonium sulfate, diphenyliodonium trifluoromethane sulfonate and triphenylsulfonium hexafluoroarsenate). Further, the photo-acid generators include those represented by the formula:

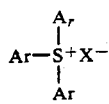

in which

Ar may be the same or different and represents a substituted or unsubstituted aromatic group such as a phenyl group, and $X^-$ represents $BF_4^-$, $SbF_6^-$, $PF_6^-$ or $AsF_6^-$; and

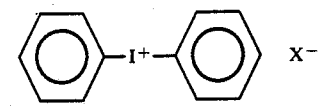

in which $X^-$ is as defined above.

In the practice of the present invention, the amount used of the photo-acid generator is such that the water-insoluble polymeric material is obtained thereby. The present inventor found that a relatively small amount of the photo-acid generator will provide the desired effects, when used in the present invention, and is usually within the range of about 2 to 10% by weight based on a combined weight of the polymeric material and photo-acid generator.

The formation of the resist patterns has been described with reference to FIGS. 1A to 1E, but, it should be noted that modifications and improvements may be made to the described pattern formation process within the scope and spirit of the present invention.

In the exposure step of the present process, the patterning radiation is preferably a deep UV radiation pattern having a wavelength of about 200 to 300 nm. The deep UV radiation may be generated from radiation sources such as a Xe-Hg (xenon-mercury vapor) lamp and an excimer laser (wavelength of 248 nm). In addition to the deep UV, other radiations such as electron beams, X-rays and ion beams may be used if desired and if not adversely affecting the patterning process and results thereof.

The resist material and pattern formation process of the present invention may be widely used to form negative resist patterns with excellent properties, and the thus formed resist patterns may be advantageously utilized in the production of semiconductor devices such as LSI and VLSI, and further may be utilized in the production of photoprinting plates and other articles, if desired.

The present invention will be further described with reference to following working examples and comparative examples:

EXAMPLE 1:

Polyvinyl alcohol (PVA) having a molecular weight of 27,000 was mixed with 5% by weight, based on a total weight of the mixture, of p-(N-phenylamino)-phenyldiazonium sulfate as the photo-acid generator and water. The thus obtained aqueous solution of the resist was spun-coated on a silicon wafer, and then dried at 60° C. for 60 minutes, and a resist layer having a layer thickness of 1.0 μm was obtained. The resist layer was exposed to a deep UV radiation pattern (4 mW/cm²) for about 15 seconds, after a wavelength of the radiation from an Xe-Hg lamp was adjusted to below 330 nm by a cold mirror. The exposed resist layer was heated at 100° C. for 45 minutes on a hot plate, to insolubilize the exposed area thereof, and after the heating was completed, the resist layer was developed with water to wash the unexpected area therefrom, whereby fine negative resist patterns having a resolution of 1.0 μm l&s (line & space) were obtained. The sensitivity was 90 mJ.

It was observed that the resist patterns had a good resistance to oxygen plasma etching.

EXAMPLE 2:

The procedure of Example 1 was repeated except that the photo-acid generator was replaced with the same amounts of diphenyliodonium trifluoromethane sulfonate. Fine negative resist patterns having a resolution of 0.8 μm 1&s and a sensitivity 120 mJ were obtained. It was observed that the resist patterns had a good resistance to oxygen plasma etching.

EXAMPLE 3:

The procedure of Example 1 was repeated except that the photo-acid generator was replaced with the same amounts of triphenylsulfonium hexafluoroarsenate. Fine negative resist patterns having a resolution of 0.8 μm 1&s and a sensitivity of 100 mJ were obtained. It was observed that the resist patterns had a good resistance to oxygen plasma etching.

EXAMPLE 4:

The procedure of Example 1 was repeated except that PVA was replaced with methyl cellulose (MC) having a molecular weight of 10,000, and the photo-acid generator was replaced with the same amounts of 2-(N-phenylamino)phenyldiazonium sulfate. Fine negative resist patterns having a resolution of 1.5 μm 1&s and a sensitivity of 90 mJ were obtained. It was observed that the resist patterns had a good resistance to oxygen plasma etching.

EXAMPLE 5:

The procedure of Example 1 was repeated except that PVA was replaced with poly(1-methyl) vinyl alcohol having a molecular weight of 20,000, and the photo-acid generator was replaced with the same amounts of 2-(N-phenylamino)phenyldiazonium sulfate. Fine negative resist patterns having a resolution of 1.0 μm 1&s and a sensitivity of 90 mJ were obtained. It was observed that the resist patterns had a good resistance to oxygen plasma etching.

EXAMPLE 6:

This example is intended to ascertain an effect of the concentration of the added photo-acid generator onto the sensitivity of the resulting resist patterns.

The procedure of Example 1 was repeated except that the photo-acid generator was replaced with different amounts of 2-(N-phenylamino)phenyldiazonium sulfate. The amount of the photo-acid generator added was varied from 2% by weight to 16% by weight. The results plotted in FIG. 2 show that all of the resist samples have a good sensitivity of 85 to 110 mJ, but it was observed that the amount of the photo-acid generator should not be less than 2% by weight, as this causes a lowering of the resist retention percentage in the exposed area as a result of insufficient amount of the photo-acid generator for insolubilizing the resist in the area in water. Similarly, the amount of the photo-acid generator should not be more than 10% by weight, as this produces foams in the resist of the exposed area as a result of an incorporation of nitrogen (N₂) gas generated therein upon exposure to pattering radiation

COMPARATIVE EXAMPLE 7:

The procedure of Example 1 was repeated except that the resist material was replaced by a commercially available novolac resin resist: OFPR-800 (product of Tokyo Oka Kogyo KK), and an excimer laser was used as the exposure source, whereby negative resist patterns having a resolution of 2.0 μm 1&s or more are obtained.

To improve the resolution, the process conditions of the above procedure were varied, but due to an insufficient light absorption, the resulting resist patterns showed an unacceptable trapezoid cross-section.

I claim:

1. A process for the formation negative of resist pattern, comprising preparing a mixture consisting of a water-soluble polymeric material having at least one hydroxyl group with a photo-acid generator capable of releasing an acid as a result of radiation exposure for patterning to prepare a resist material, coating a solution of said resist material onto a substrate to form a resist layer, exposing said resist layer to patterning radiation to cause a reaction of said polymeric material and said photo-acid generator and a release of said acid, heating the expose resist layer in the presence of said acid as a catalyst to remove water from the resulting reaction product in said resist layer, thereby insolubilizing said reaction product in water, and developing said resist layer with water to remove said water-soluble polymeric material in unexposed areas of said layer to form resist patterns on said substrate.

2. The process according to claim 1, wherein said polymeric material has no aromatic ring in a molecular structure thereof.

3. The process according to claim 1, wherein a carbon atom adjacent to another carbon atom to which said hydroxyl group is bonded in said polymeric material contains at least one hydrogen atom which can be combined with said split-off hydroxyl group to form water, which is then removed from said polymeric material.

4. The process according to claim 1, wherein said polymeric material is polyvinyl alcohol or derivatives thereof.

5. The process according to claim 1, wherein said polymeric material is cellulose or derivatives thereof.

6. The process according to claim 1, wherein said photo-acid generator is an onium compound or derivatives thereof.

7. The process according to claim 1, wherein said photo-acid generator is represented by the formula:

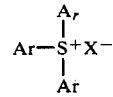

in which
Ar may be the same or different and represents a substituted or unsubstituted aromatic group, and
X⁻ represents BF₄⁻, SbF₆⁻, PF₆⁻ or AsF₆⁻.

8. The process according to claim 1, wherein said photo-acid generator is represented by the formula:

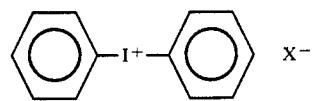

in which X⁻ represents BF₄⁻, SbF₆, SbF₆⁻, PF₆⁻ or AsF₆⁻.

9. The process according to claim 1, wherein said photo-acid generator is used in an amount of 2 to 10% by weight based on a combined weight of said polymeric material and said photo-acid generator.

10. The process according to claim 1, wherein said patterning radiation used in said exposure step is a deep ultraviolet radiation having a wavelength of 200 to 300 nm.

11. The process according to claim 10, wherein said deep ultraviolet radiation is generated from a Xe-Hg (xenon-mercury vapor) lamp.

12. The process according to claim 10, wherein said deep ultraviolet radiation is generated from an excimer laser.

13. The process according to claim 1 which is used in the formation of negative resist patterns in the production of semiconductor devices.

* * * * *